(12) United States Patent
Chang et al.

(10) Patent No.: US 8,643,070 B2
(45) Date of Patent: Feb. 4, 2014

(54) CHIP PACKAGE AND METHOD FOR FORMING THE SAME

(76) Inventors: Shu-Ming Chang, New Taipei (TW);
Chien-Hui Chen, Zhongli (TW);
Yen-Shih Ho, Kaohsiung (TW);
Chien-Hung Liu, New Taipei (TW);
Ho-Yin Yiu, Kln (HK); Ying-Nan Wen, Hsinchu (TW)

( * ) Notice: Subject to any disclaimer, the term of this patent is extended or adjusted under 35 U.S.C. 154(b) by 20 days.

(21) Appl. No.: 13/314,122

(22) Filed: Dec. 7, 2011

(65) Prior Publication Data

US 2012/0146108 A1 Jun. 14, 2012

Related U.S. Application Data

(60) Provisional application No. 61/421,172, filed on Dec. 8, 2010.

(51) Int. Cl.
*H01L 29/76* (2006.01)

(52) U.S. Cl.
USPC .......................................... 257/288

(58) Field of Classification Search
USPC .......... 257/213–413, 900, 902–903, E21.345, 257/E29.133, E21.418, E29.02, E29.257, 257/E29.26, 923, E21.629, E29.027, 257/E29.146; 438/270
See application file for complete search history.

(56) References Cited

U.S. PATENT DOCUMENTS

| 7,087,959 | B2 * | 8/2006 | Shibib et al. .................. 257/335 |
| 7,385,251 | B2 * | 6/2008 | Chang et al. .................. 257/347 |
| 7,728,371 | B2 * | 6/2010 | Cheng et al. .................. 257/301 |
| 2003/0052409 | A1 * | 3/2003 | Matsuo et al. ................ 257/737 |
| 2004/0031987 | A1 * | 2/2004 | Henninger et al. ........... 257/328 |
| 2004/0043565 | A1 * | 3/2004 | Yamaguchi et al. .......... 438/268 |
| 2010/0155932 | A1 * | 6/2010 | Gambino et al. ............. 257/698 |
| 2010/0171218 | A1 * | 7/2010 | Aoi .............................. 257/741 |

FOREIGN PATENT DOCUMENTS

CN 102214623 10/2011

* cited by examiner

*Primary Examiner* — Dao H Nguyen
*Assistant Examiner* — Tram H Nguyen
(74) *Attorney, Agent, or Firm* — Liu & Liu

(57) ABSTRACT

An embodiment of the invention provides a chip package which includes: a semiconductor substrate having a first surface and an opposite second surface; a drain region located in the semiconductor substrate; a source region located in the semiconductor substrate; a gate located on the semiconductor substrate or at least partially buried in the semiconductor substrate, wherein a gate dielectric layer is between the gate and the semiconductor substrate; a drain conducting structure disposed on the first surface of the semiconductor substrate and electrically connected to the drain region; a source conducting structure disposed on the second surface of the semiconductor substrate and electrically connected to the source region; and a gate conducting structure disposed on the first surface of the semiconductor substrate and electrically connected to the gate.

20 Claims, 22 Drawing Sheets

CHIP PACKAGE AND METHOD FOR FORMING THE SAME

CROSS REFERENCE TO RELATED APPLICATIONS

This Application claims the benefit of U.S. Provisional Application No. 61/421,172, filed on Dec. 8, 2010, the entirety of which is incorporated by reference herein.

BACKGROUND OF THE INVENTION

1. Field of the Invention

The invention relates to a chip package, and in particular relates to a MOSFET chip package.

2. Description of the Related Art

The chip packaging process is an important process when fabricating an electronic product. Chip packages not only provide chips with protection from environmental contaminants, but also provide an interface for connection between electronic elements in the chips and electronic elements outside of the chip package.

Reducing the size of a chip package and further improving performance of the chip package have become important issues.

BRIEF SUMMARY OF THE INVENTION

An embodiment of the invention provides a chip package which includes: a semiconductor substrate having a first surface and an opposite second surface; a drain region located in the semiconductor substrate; a source region located in the semiconductor substrate; a gate located on the semiconductor substrate or at least partially buried in the semiconductor substrate, wherein a gate dielectric layer is between the gate and the semiconductor substrate; a drain conducting structure disposed on the first surface of the semiconductor substrate and electrically connected to the drain region; a source conducting structure disposed on the second surface of the semiconductor substrate and electrically connected to the source region; and a gate conducting structure disposed on the first surface of the semiconductor substrate and electrically connected to the gate.

An embodiment of the invention provides a method for forming a chip package which includes: providing a semiconductor substrate having a first surface and a second surface, wherein the semiconductor substrate has a drain region and a source region therein, a gate is located on the semiconductor substrate or buried in the semiconductor substrate, and a gate dielectric layer is between the gate and the semiconductor substrate; forming a drain conducting structure on the first surface of the semiconductor substrate, wherein the drain conducting structure is electrically connected to the drain region; forming a source conducting structure on the second surface of the semiconductor substrate, wherein the source conducting structure is electrically connected to the source region; and forming a gate conducting structure on the first surface of the semiconductor substrate, wherein the gate conducting structure is electrically connected to the gate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
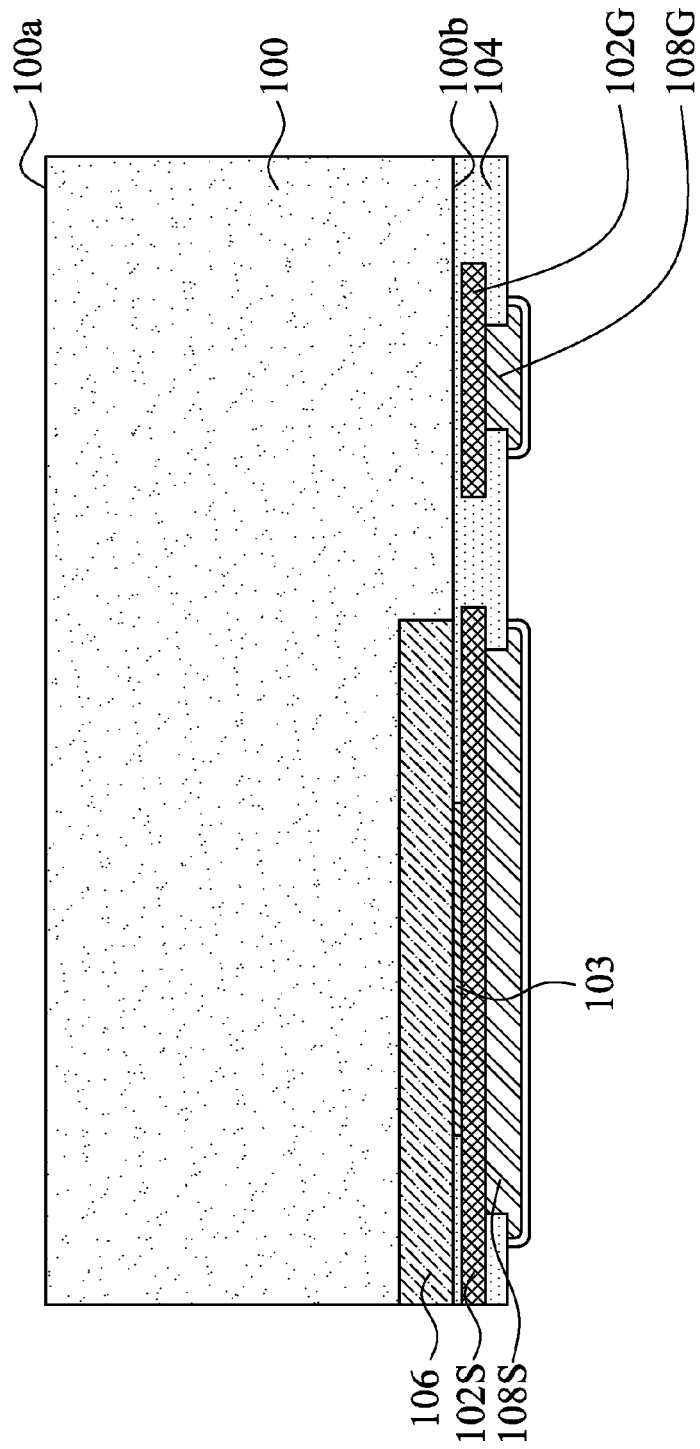
FIGS. 1A-1R are cross-sectional views showing the steps of forming a chip package according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a MOSFET chip such as a power module chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power ICs.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

Figure 1B:
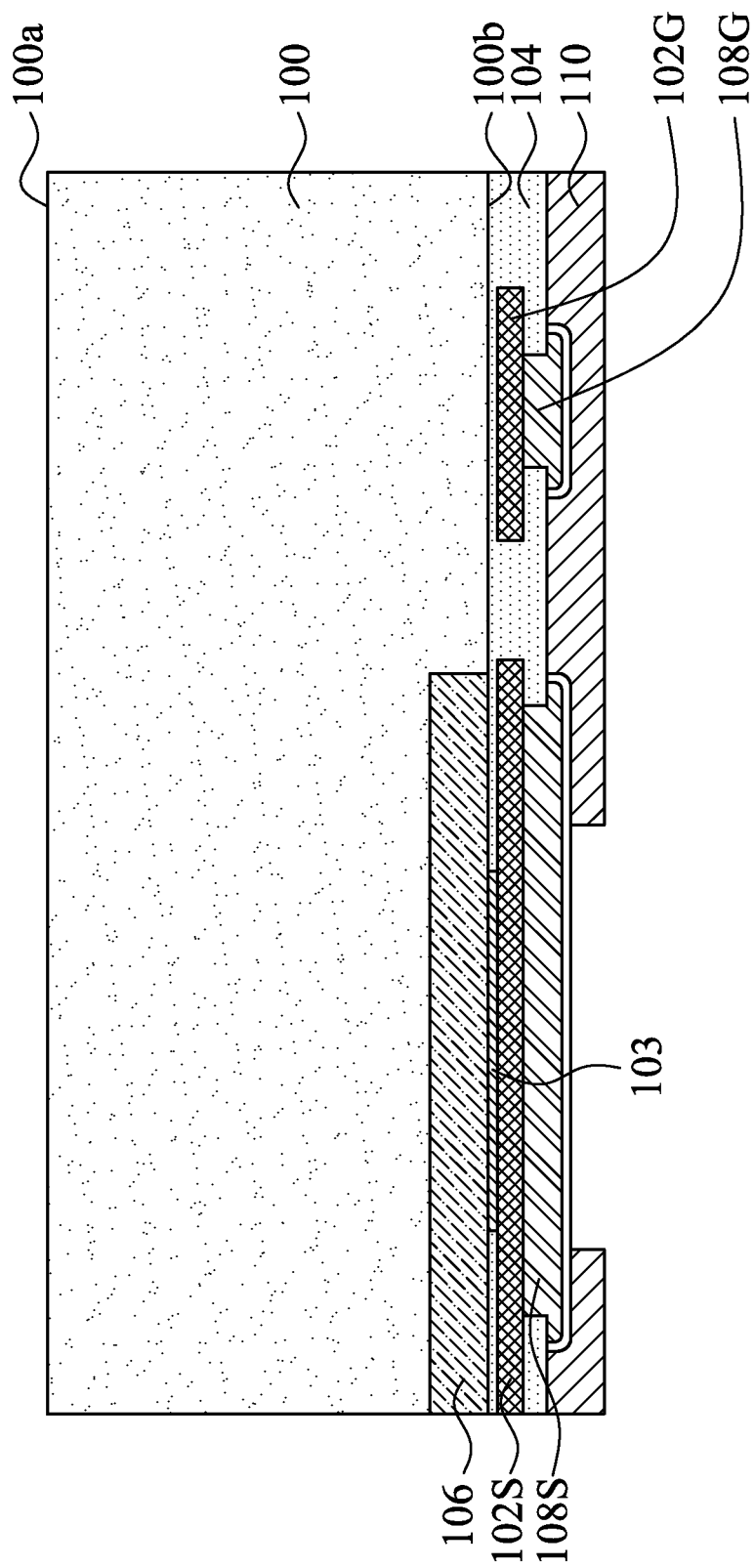
Figure 1C:
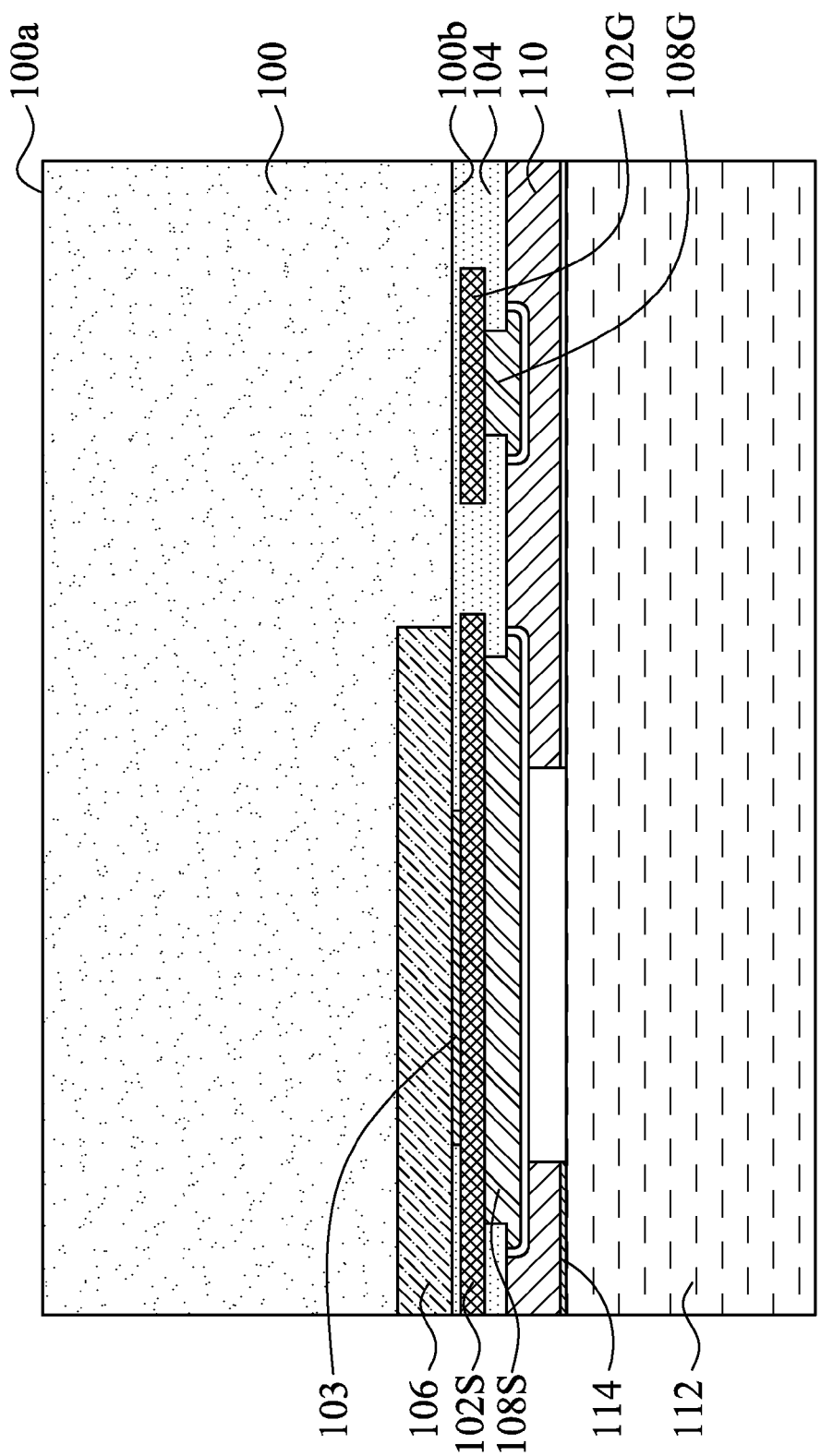
Figure 1D:
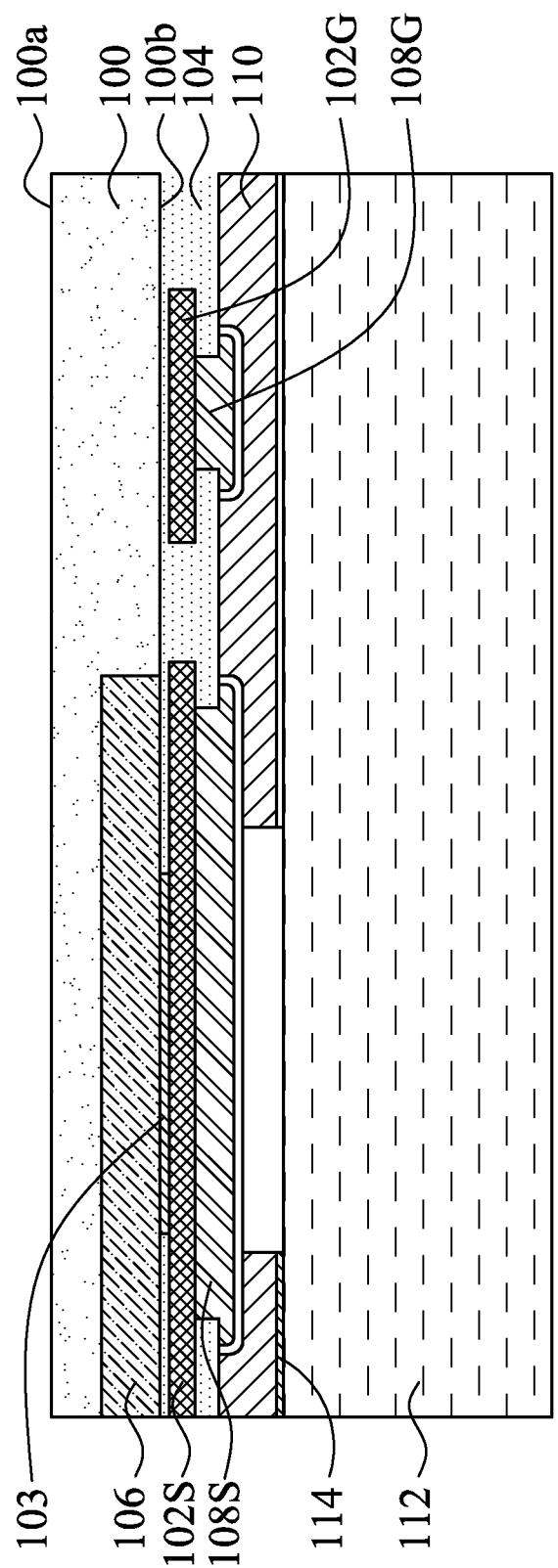
Figure 1E:
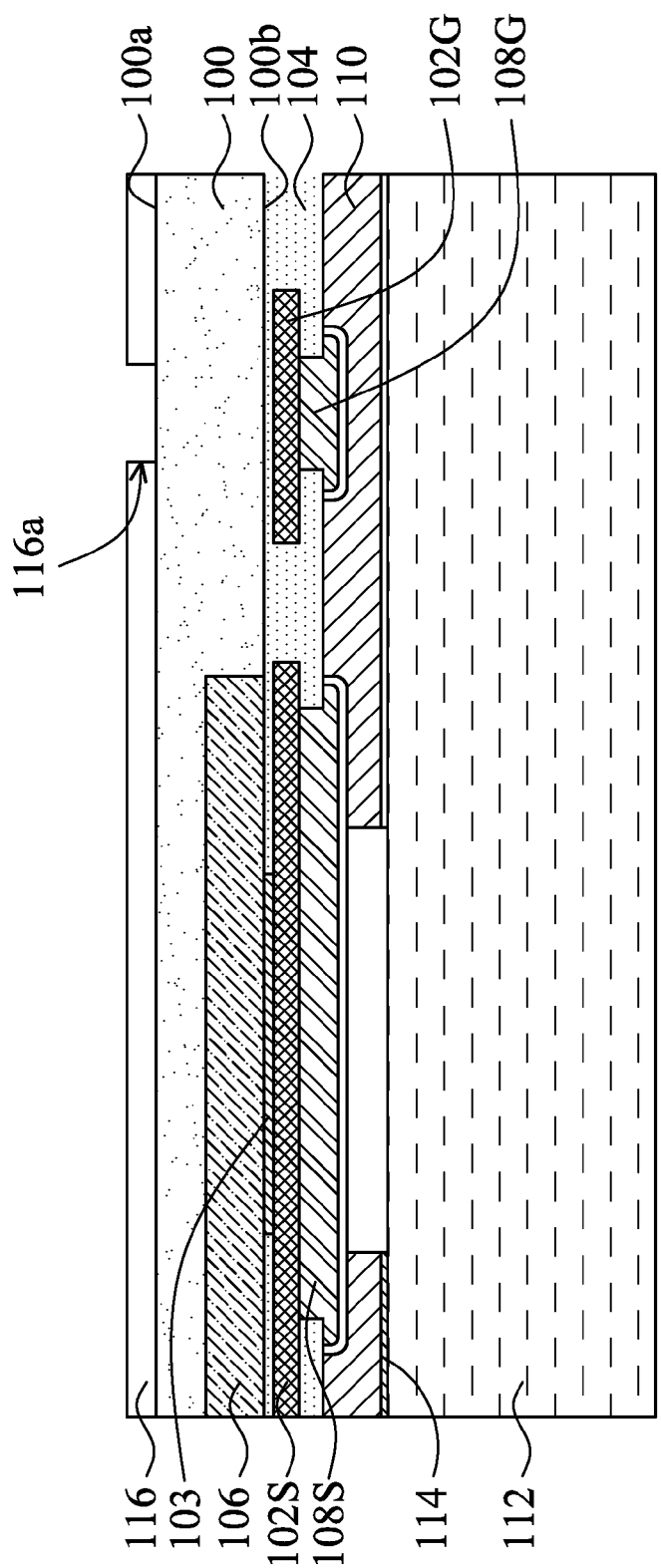
Figure 1F:
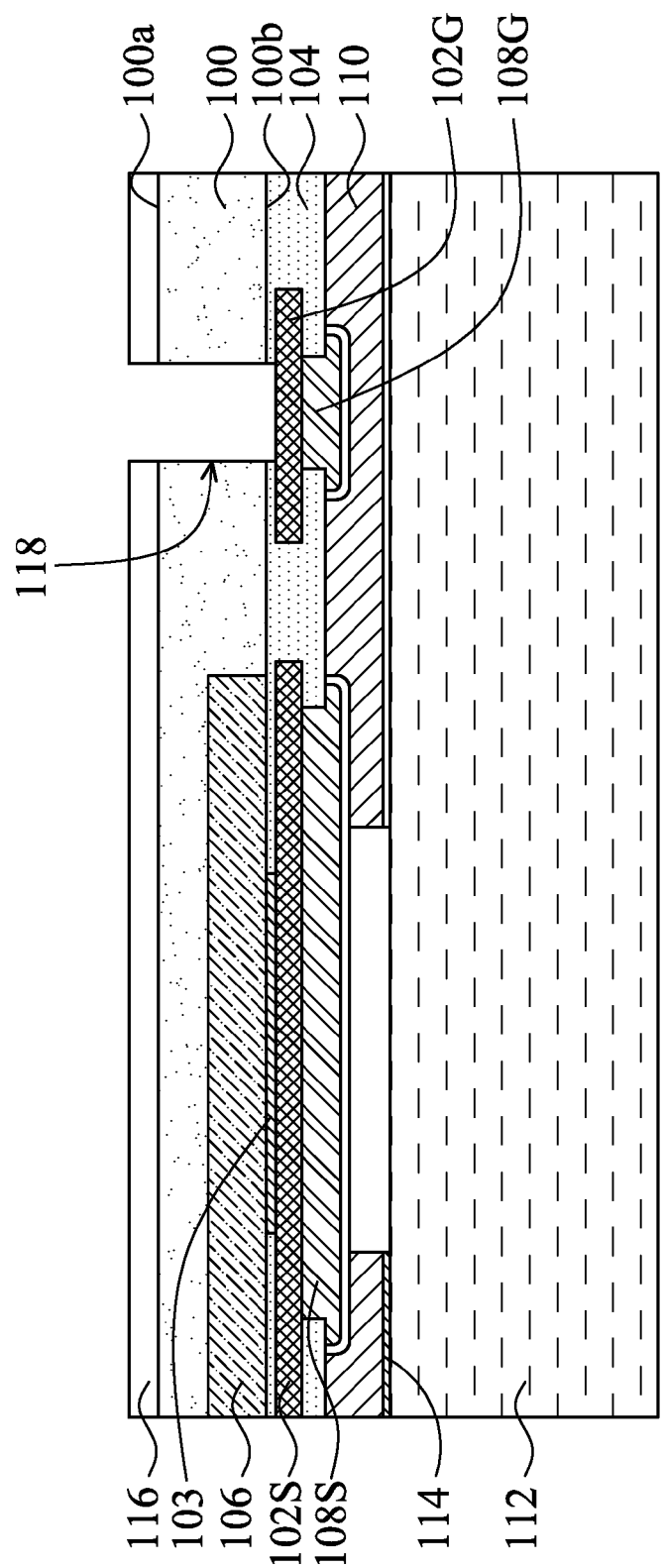
Figure 1G:
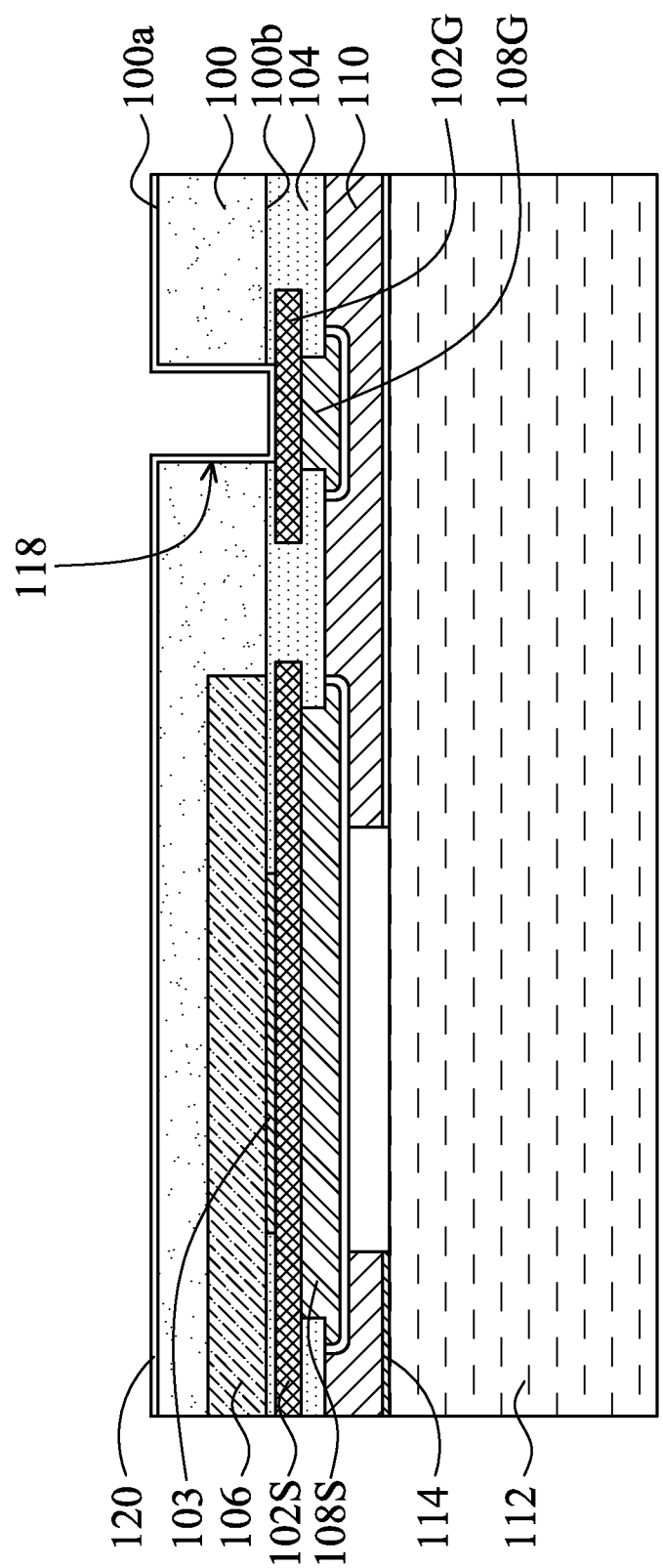
Figure 1H:
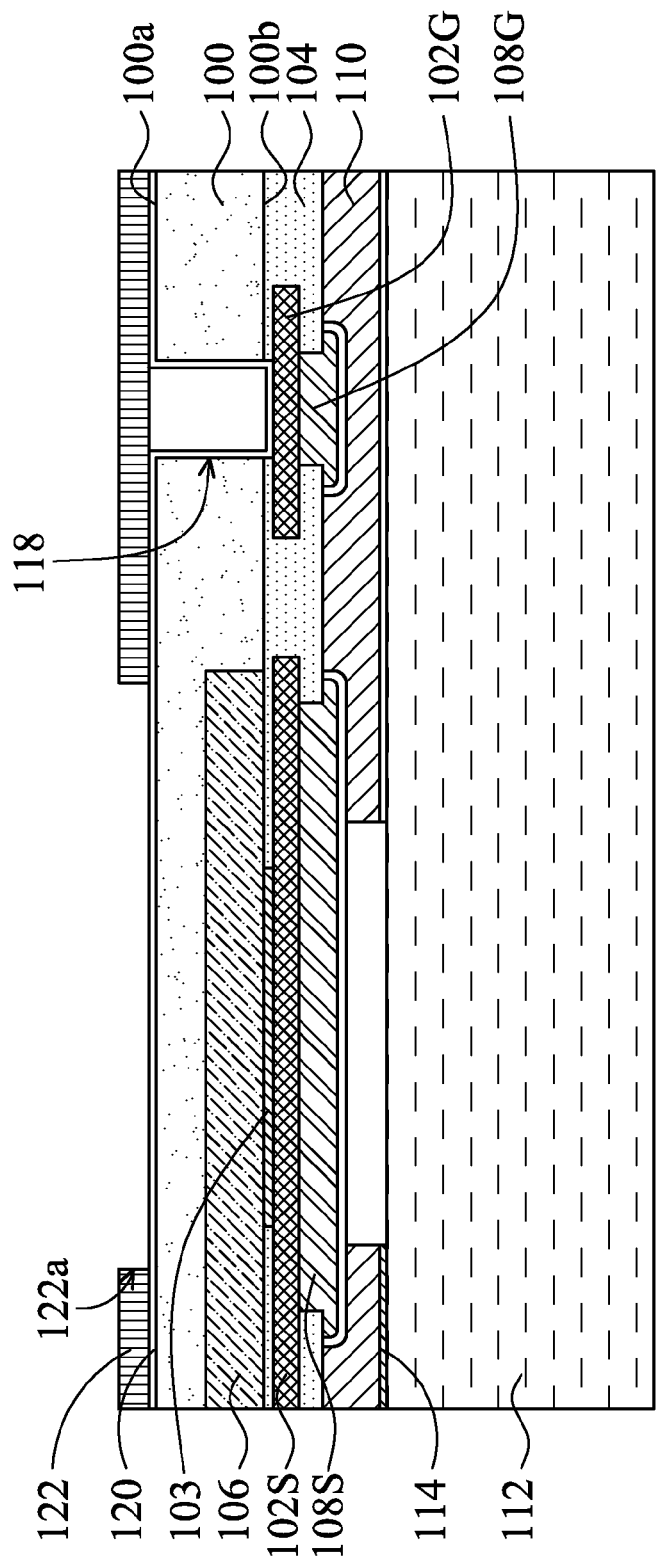
Figure 1I:
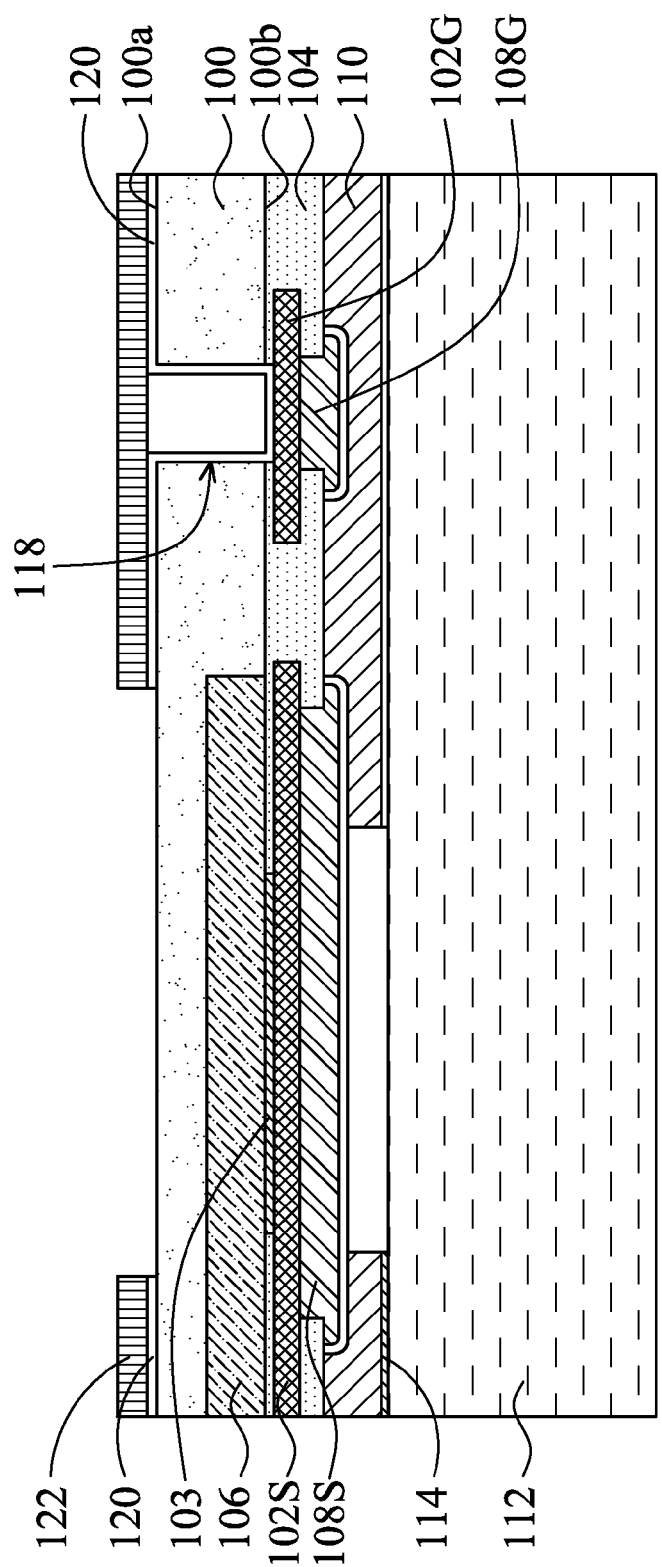
Figure 1J:
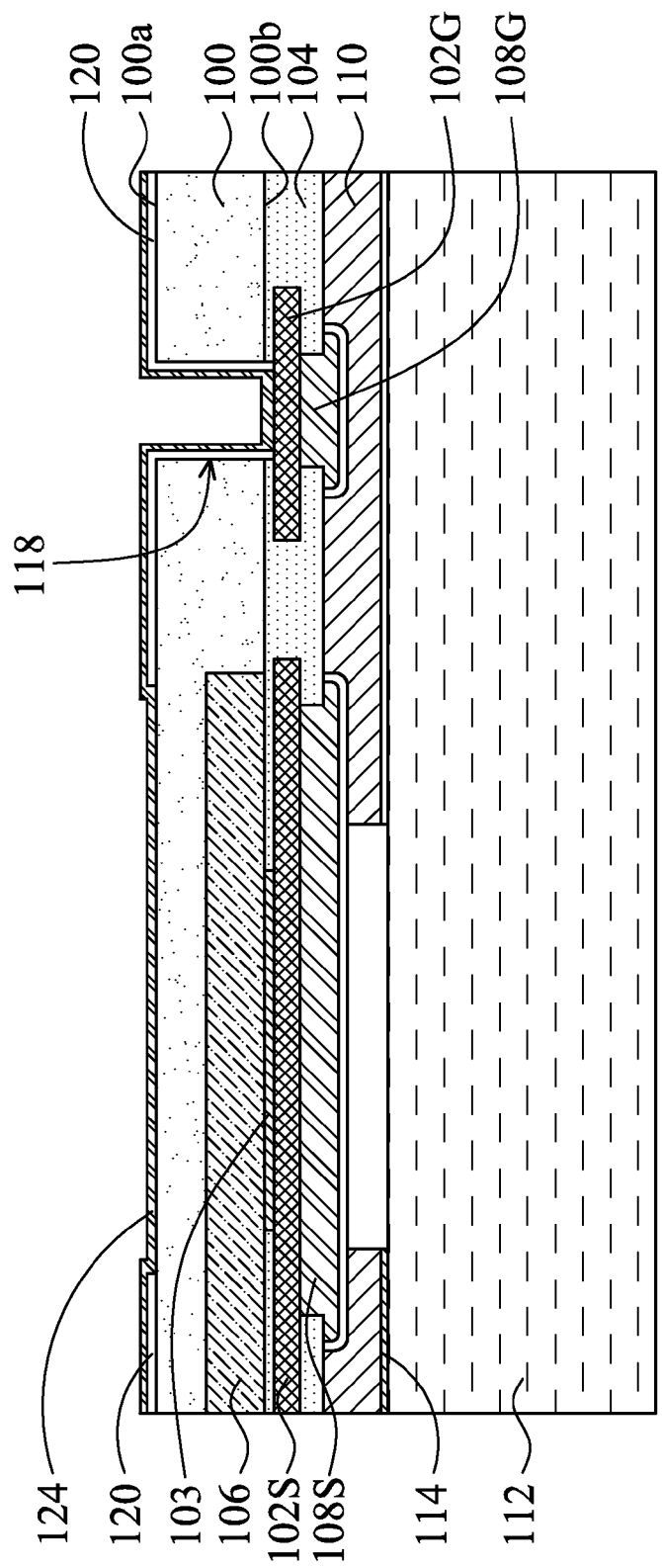
Figure 1K:
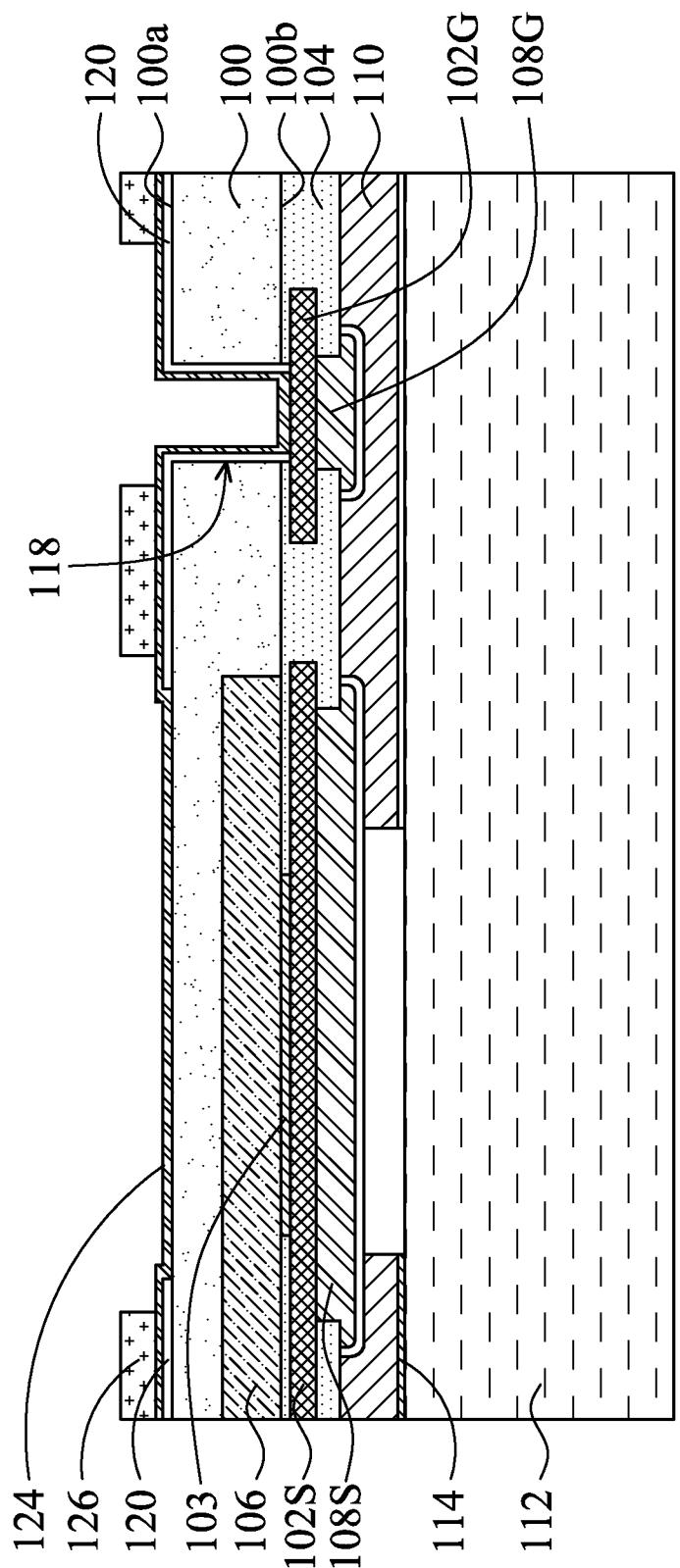
Figure 1L:
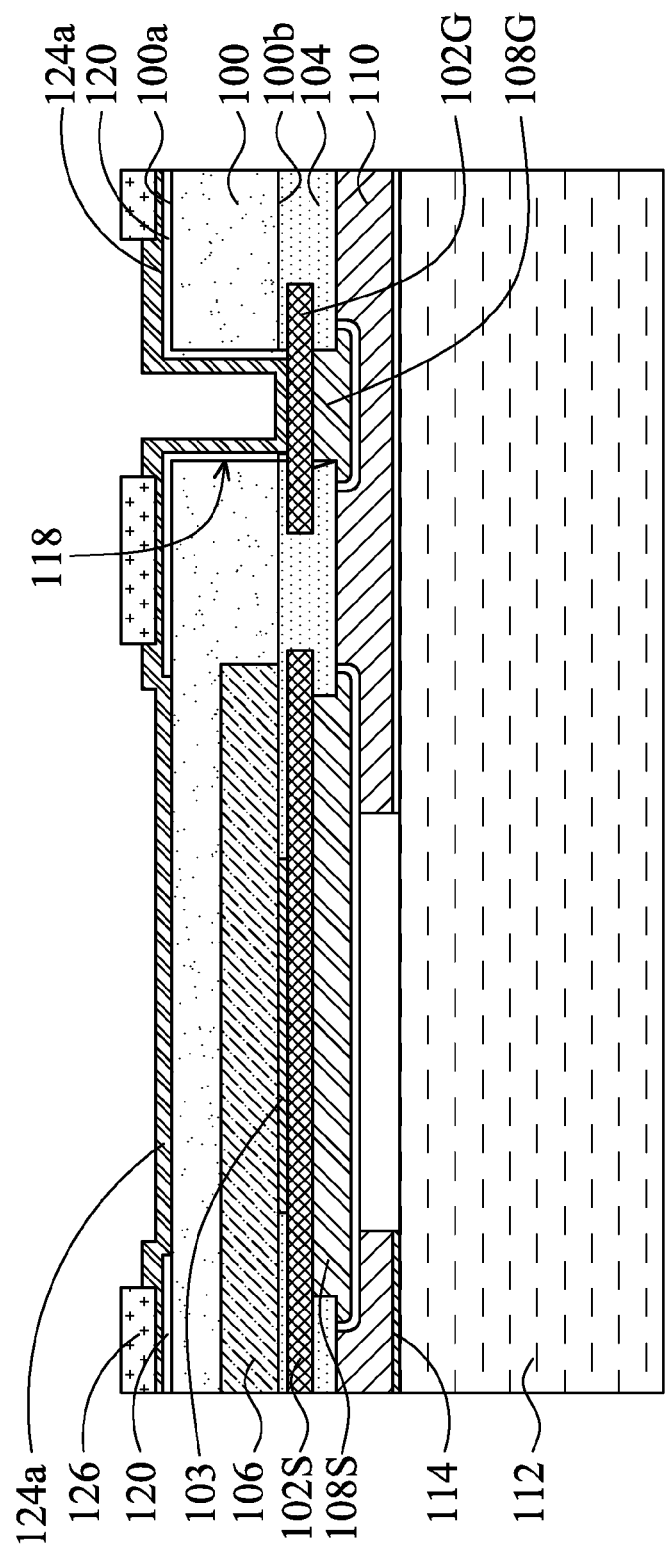
Figure 1M:
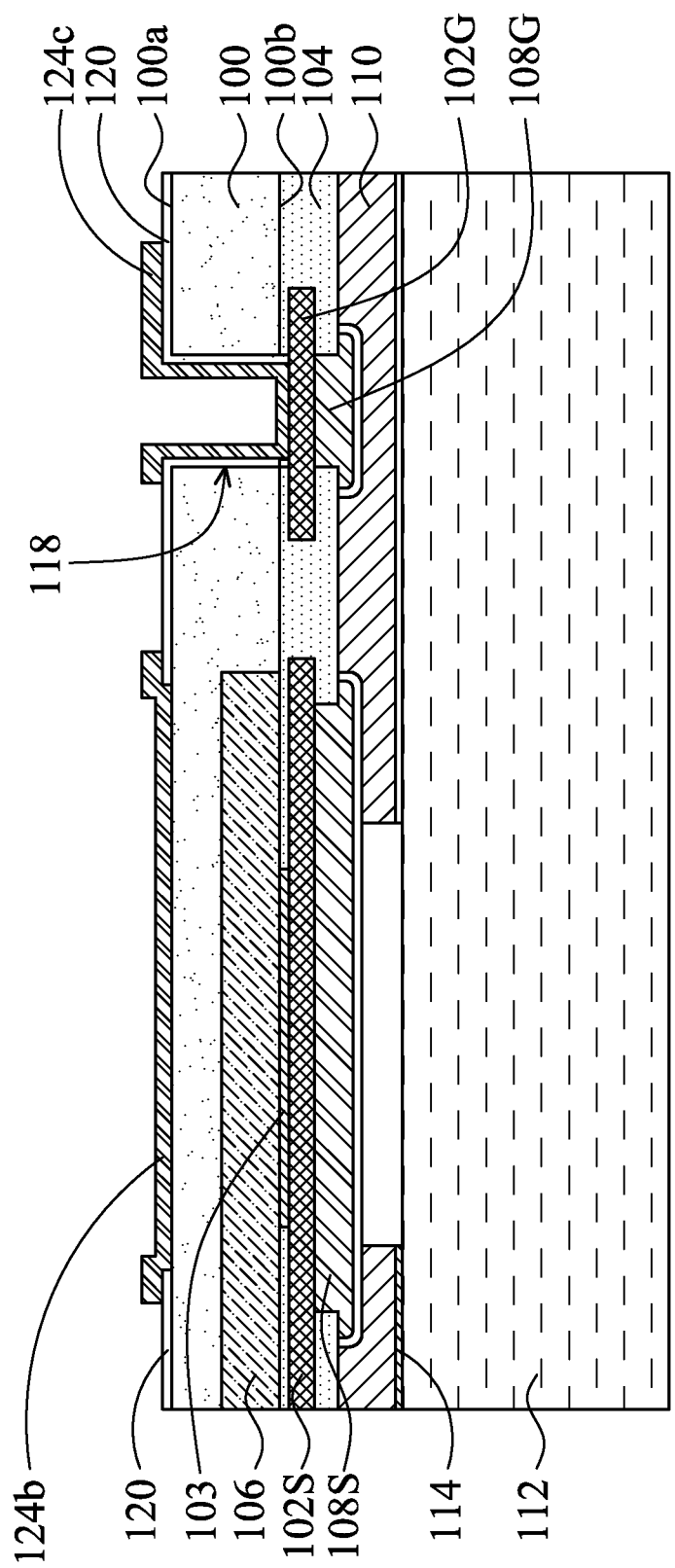
Figure 1N:
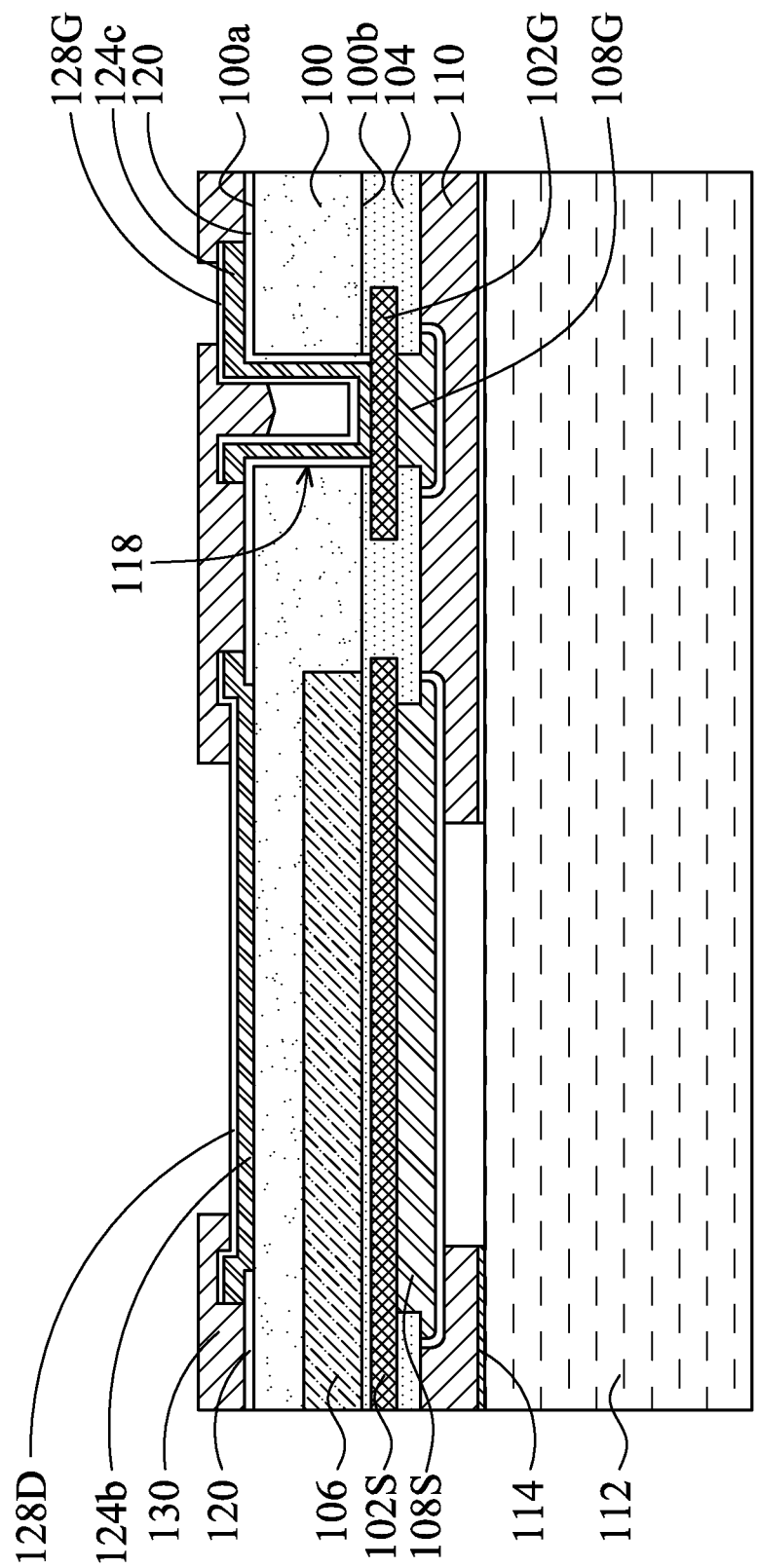
Figure 1O:
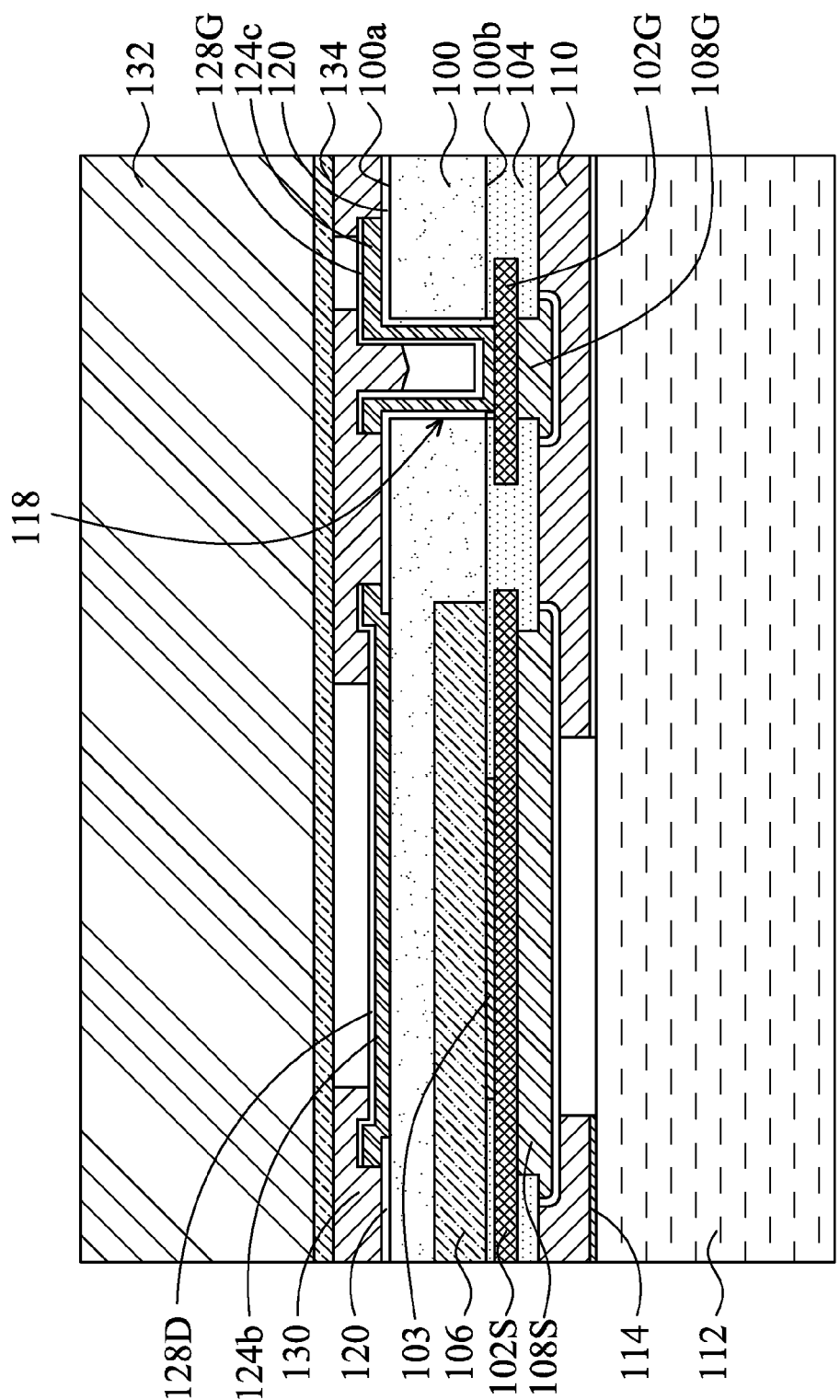
Figure 1P:
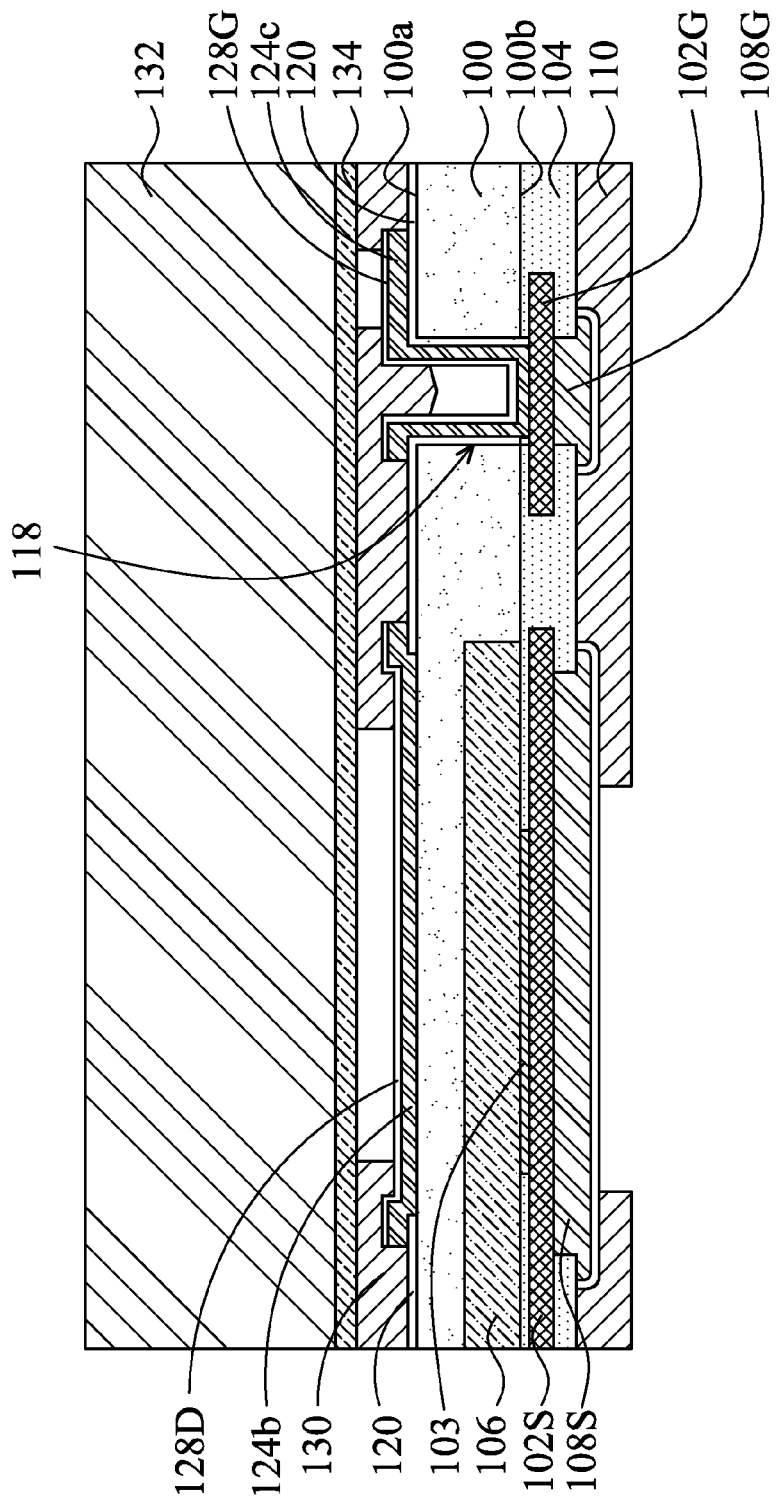
Figure 1Q:
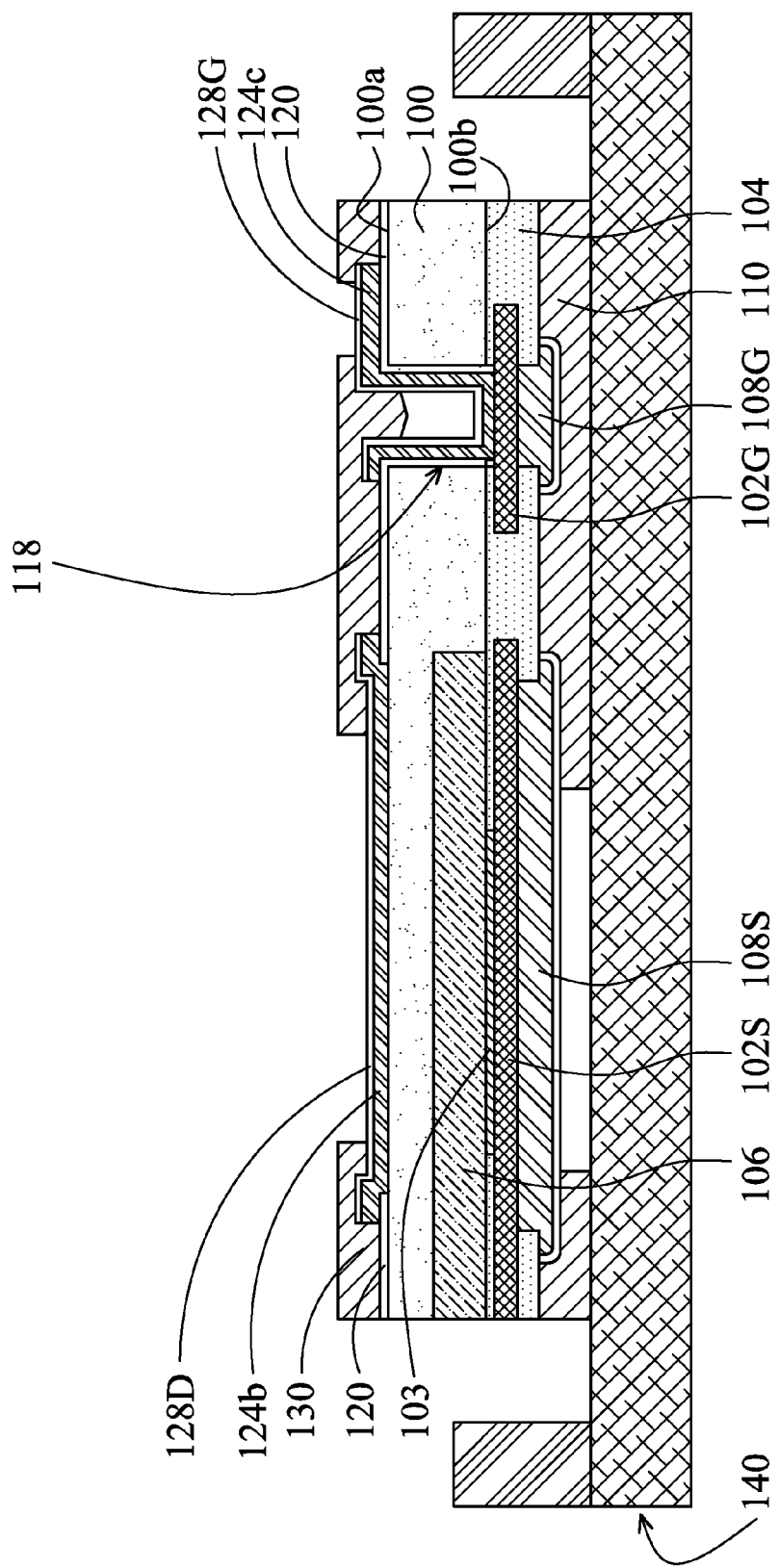
Figure 1R:
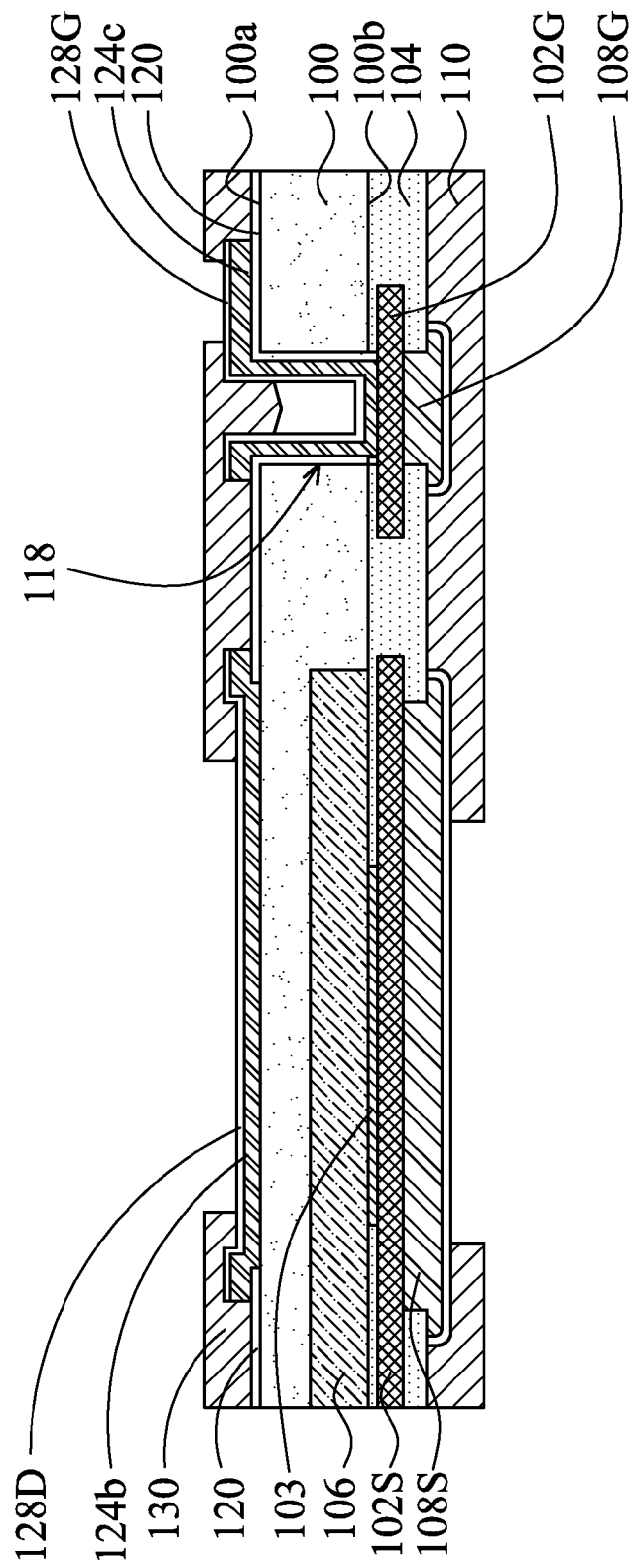

FIGS. 1A-1R are cross-sectional views showing the steps of forming a chip package according to an embodiment of the present invention. As shown in FIG. 1A, a semiconductor substrate 100 is provided, which has a surface 100a and a surface 100b. The semiconductor substrate 100 may be, for example, a silicon substrate such as a silicon wafer. In another embodiment, the semiconductor substrate 100 may also be other suitable semiconductor materials such as germanium, silicon germanium, silicon carbide, gallium arsenide, or the like.

A source region 106 and a drain region may be preformed in the semiconductor substrate 100. In one embodiment, a conductivity type of the semiconductor substrate 100 may be an N-type or P-type. Typically, the conductivity type of the semiconductor substrate 100 is commonly N-type. Take the N-type semiconductor substrate 100 as an example, the semiconductor substrate 100 may be a silicon substrate doped with N-type dopants. The type and doping concentration of the dopant in the semiconductor substrate 100 may not be uniform. For example, the type and doping concentration of an n-type dopant doped in a lower portion of the semiconductor substrate 100 (the portion near the surface 100b) may be different from those of an n-type dopant doped in an upper portion of the semiconductor substrate 100 (the portion near the surface 100a). The semiconductor substrate 100, by itself, may form a drain region. Thus, the reference number 100 may also represent the drain region (i.e., the portion of the semiconductor substrate not formed with the source region or another doped region).

In one embodiment, the semiconductor substrate 100 may include a doped region (not shown) which may extend from the surface 100b or a position near the surface 100b towards the surface 100a. The conductivity type of the doped region is different from that of the semiconductor substrate 100. For example, if the semiconductor substrate 100 is an n-type substrate, the conductivity type of the doped region is p-type, and vice versa.

In one embodiment, the semiconductor substrate 100 includes a source region 106 which may be located in the doped region. The conductivity types of the source region 106 and the semiconductor substrate 100 are the same, such as n-type. In one embodiment, the source region 106 extends from the surface 100b or a position near the surface 100b towards the surface 100a, and may be partially surrounded by the doped region. In FIG. 1A, for simplicity and clarity, only the source region 106 is illustrated.

In one embodiment, a dielectric layer 104 is disposed on the surface 100b of the semiconductor substrate 100. A source electrode 102S may be formed in the dielectric layer 104, which may be electrically connected to the source region 106 through a conducting path formed in the dielectric layer 104 and/or the semiconductor substrate 100. For example, in the embodiment shown in FIG. 1A, a via structure 103 is formed in the dielectric layer 104, which is electrically connected to the source electrode 102S and the source region 106.

In one embodiment, a gate 102G may also be formed in the dielectric layer 104, which may be, for example, (but is not limited to) a polysilicon layer. The dielectric layer 104 between the gate 102G and the semiconductor substrate 100 may be used as a gate dielectric layer. In addition, in another embodiment, the gate and the gate dielectric layer may be a buried structure, which may be formed in a recess of the substrate. In this case, the gate 102G is at least partially buried in the semiconductor substrate 100.

Next, as shown in FIG. 1A, a source conducting pad 108S may be formed on the source electrode 102S, and a gate conducting pad 108G may be optionally formed on the gate 102G. The source electrode 102S and the source conducting pad 108S may together serve as a source conducting structure electrically connected to the source region 106. The source conducting structure is located on the surface 100b of the semiconductor substrate 100.

Next, as shown in FIG. 1B, a protection layer 110 may be formed on the surface 100b of the semiconductor substrate 100. The protection layer 110 has at least an opening exposing a portion of the source electrode 102S (i.e., a portion of the source conducting structure is exposed). In one embodiment, a protection layer bump may be located in the opening, which may be formed during the patterning process of the protection layer 110 according to design requirements. The exposed source conducting structure may be used to be electrically connected to another conducting structure. In one embodiment, a conducting bump or a solder ball may be optionally formed on the exposed source conducting structure. In one embodiment, the protection layer 110 may cover the gate 102G.

Next, as shown in FIG. 1C, a carrier substrate 112 may be optionally disposed on the surface 100b of the semiconductor substrate 100. In one embodiment, the semiconductor substrate 100 may be fixed on the carrier substrate 112 by an adhesion layer 114, wherein the adhesion layer 114 may be located between the protection layer 110 and the carrier substrate 112. In another embodiment, the chosen material of the protection layer 110 may have adhesion ability. In this case, the adhesion layer 114 may not need to be formed, and the carrier substrate 112 may be set to directly contact with the protection layer 110 such that the semiconductor substrate 100 is fixed on the carrier substrate 112. The disposed carrier substrate 112 facilitates the proceeding of subsequent processes.

Next, as shown in FIG. 1D, the semiconductor substrate 100 may be optionally thinned. For example, the carrier substrate 112 may be used as a support, and the semiconductor substrate 100 is thinned to a suitable thickness from the surface 100a of the semiconductor substrate 100. A suitable thinning process may be, for example, (but is not limited to) a mechanical polishing, chemical mechanical polishing, and/or the like.

Next, as shown in FIG. 1E, a mask layer 116 is formed on the surface 100a of the semiconductor substrate 100. The mask layer 116 has an opening 116a which exposes a portion of the semiconductor substrate 100. The location of the opening 116a may be substantially right above the gate 102G.

Next, as shown in FIG. 1F, a portion of the semiconductor substrate 100 is removed from the surface 100a of the semiconductor substrate 100 to form a hole 118 extending towards the surface 100b. For example, the semiconductor substrate 100 may be removed by etching to form the hole 118. The hole 118 may expose the gate 102G. The mask layer 116 may protect the semiconductor substrate 100 thereunder from being damaged during the formation step of the hole 118.

Next, as shown in FIG. 1G, an insulating layer 120 is formed on a sidewall of the hole 118 by using, for example, a vapor deposition process or an applying process. The insulating layer 120 may cover a bottom of the hole 118 and extend onto the surface 100a of the semiconductor substrate 100. In subsequent processes, a conducting layer electrically connected to the gate 102G will be formed in the hole 118. Thus, a patterning process may be performed to remove the insulating layer 120 on the bottom of the hole 118 such that the gate 102G is exposed. The insulating layer 120 on the bottom of the hole 118 may be removed at any moment after the formation of the insulating layer 120 and before the formation of the conducting layer.

Next, as shown in FIGS. 1H-1I, a patterning process of the insulating layer 120 is performed to expose a portion of the surface 100a of the semiconductor substrate 100 (i.e., the drain region is exposed). As shown in FIG. 1H, a mask layer 122 may be disposed on the surface 100a of the semiconductor substrate 100. The mask layer 122 has at least an opening 122a which exposes a portion of the insulating layer 120. Then, the exposed insulating layer 120 is removed, as shown in FIG. 1I. For example, the exposed insulating layer 120 may be removed by using an etching process, wherein the insulating layer 120 covered by the mask layer 122 may be substantially not etched. In one embodiment, a dry film may be chosen to be the mask layer 122. The dry film is substantially not filled into the hole 118, thus a subsequent cleaning process of the hole may be not needed.

Next, as shown in FIG. 1J, the mask layer 122 is removed, and a portion of the insulating layer 120 on the bottom of the hole 118 is removed such that the gate 102G is exposed. Then, a seed layer 124 is formed on the surface 100a of the semiconductor substrate 100, which electrically contacts with the exposed semiconductor substrate 100 (i.e., the drain region). The seed layer 124 further extends onto the bottom of the hole 118 along the sidewall of the hole 118 to electrically contact with the gate 102G.

Next, as shown in FIG. 1K, a mask layer 126 is formed on the seed layer 124, wherein the seed layer 124 covered thereunder will be removed in subsequent processes. The mask layer 126 has openings which at least expose the seed layer 124 on the drain region and the seed layer 124 in the hole 118.

Next, as shown in FIG. 1L, an electroplating process is performed to electroplate a conducting material on the exposed seed layer 124 to form a conducting layer 124a. As shown in FIG. 1M, the mask layer 126 is then removed, and the seed layer originally covered by the mask layer 126 is removed to form a drain conducting layer 124b and a gate conducting layer 124c. The seed layer covered by the mask layer 126 may be removed by using, for example, an etching process. Thus, the thicknesses of the drain conducting layer 124b and the gate conducting layer 124c, which were originally the conducting layer 124a, are thinner than the thickness of the original conducting layer 124a due to the etching process.

It should be appreciated that although the conducting layer is formed by electroplating in the embodiment mentioned above, embodiments of the invention are not limited thereto. In another embodiment, a vapor deposition process or a applying process may be performed to form a conducting material layer, and the conducting material layer may be patterned to be a desired conducting layer by using a photolithography process and an etching process. In this case, the seed layer may not need to be formed.

In addition, in the embodiment mentioned above, although the insulating layer 120 on the bottom of the hole 118 is removed after a portion of the insulating layer 120 on the drain region is removed, embodiments of the invention are not limited thereto. For example, the insulating layer 120 on the bottom of the hole 118 may first be removed, and a portion of the insulating layer 120 on the drain region is then removed. Alternatively, in one embodiment, the insulating layer 120 on the bottom of the hole 118 and a portion of the insulating layer 120 on the drain region may be simultaneously removed.

Next, as shown in FIG. 1N, under bump metallurgy layers 128D and 128G may be optionally formed on the drain conducting layer 124b and the gate conducting layer 124c, respectively, wherein the under bump metallurgy layer 128D and the drain conducting layer 124b are used as a drain conducting structure of the drain region, and the under bump metallurgy layer 128G and the gate conducting layer 124c are used as a gate conducting structure of the gate 102G. Then, a protection layer 130 is formed on the surface 100a of the semiconductor substrate 100, which has openings exposing a portion of the under bump metallurgy layers 128D and 128G, respectively. That is, the protection layer 130 has at least an opening exposing the drain conducting structure and at least an opening exposing the gate conducting structure, respectively. In one embodiment, a protection layer bump may be located in the opening exposing the drain conducting structure, which may be formed during the patterning process of the protection layer 130 according to design requirements.

As shown in FIG. 1O, a carrier substrate 132 may then be optionally disposed on the surface 100a of the semiconductor substrate 100 through an adhesion layer 134. Then, as shown in FIG. 1P, the adhesion layer 114 and the carrier substrate 112 below the surface 100b of the semiconductor substrate 100 are removed. After the carrier substrate 112 is removed, the carrier substrate 132 disposed on the surface 100a of the semiconductor substrate 100 may be used as a working substrate when the semiconductor substrate 100 needs to be moved.

As shown in FIG. 1Q, the semiconductor substrate 100 may then be disposed on a film frame 140, and the previously disposed carrier substrate 132 is removed, wherein the surface 100b of the semiconductor substrate 100 faces the film frame 140. For example, in one embodiment, the semiconductor substrate 100 is a semiconductor wafer having a plurality of MOSFETs which are separated from each other by predetermined scribe lines. In this case, the semiconductor substrate 100 may be further diced along the scribe lines to form a plurality of individual chip packages for use. The individual chip package may be taken from the film frame 140 for use, as shown in FIG. 1R.

Figure 2A:
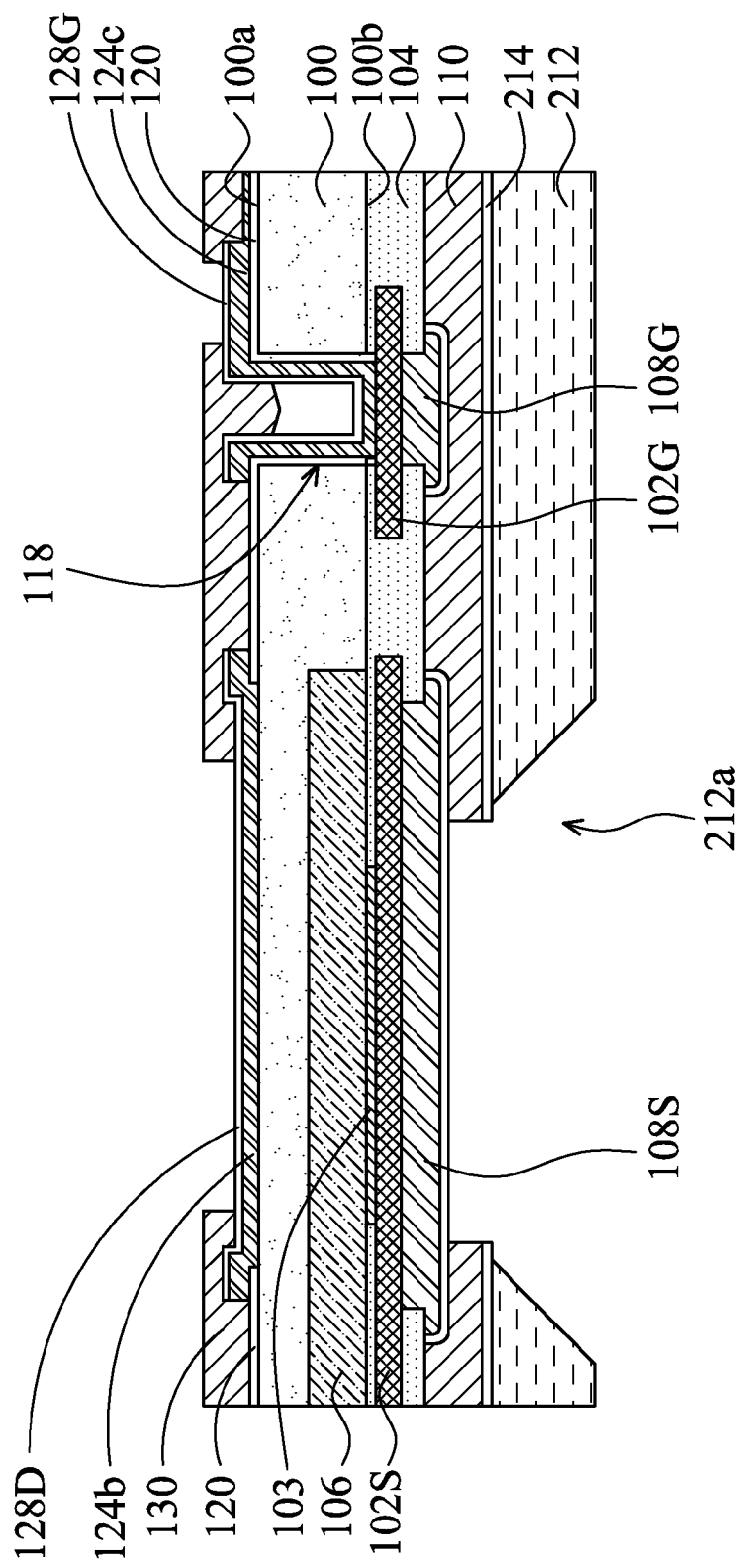
FIGS. 2A-2C are cross-sectional views showing chip packages according to embodiments of the present invention.
Figure 2B:
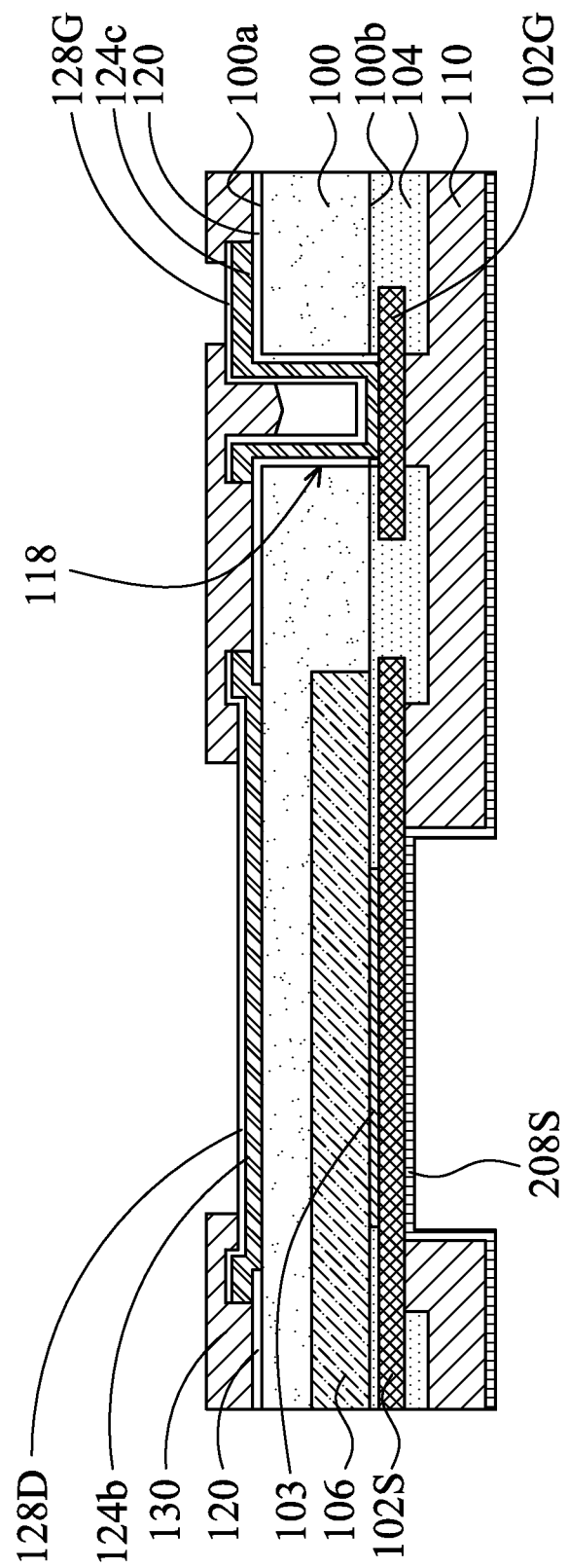
Figure 2C:
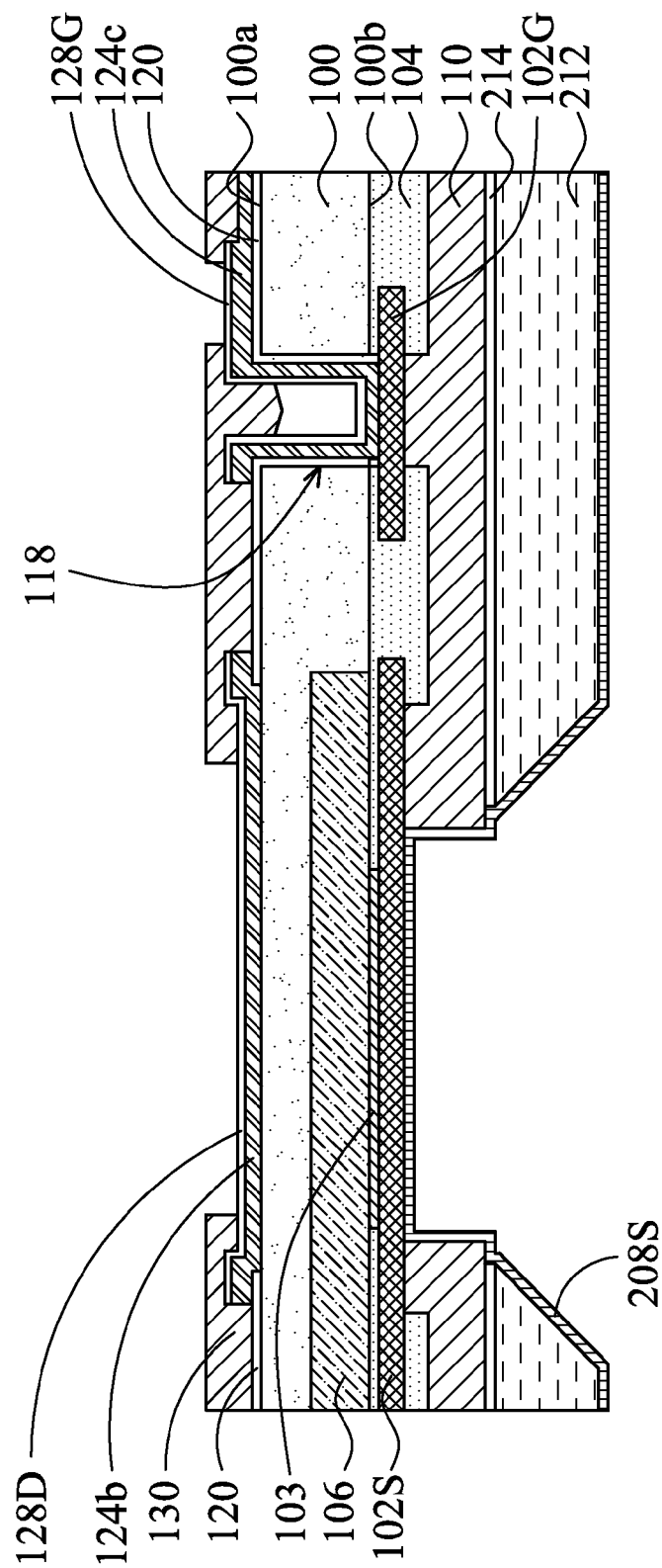

Embodiments of the invention may have a variety of variations. FIGS. 2A-2C are cross-sectional views showing chip packages according to exemplary embodiments of the present invention, wherein same or similar reference numbers are used to designate same or similar elements.

As shown in FIG. 2A, the main difference between this embodiment and the embodiment shown in FIG. 1 is that the embodiment in FIG. 2A includes a carrier substrate 212 which is not removed. The kept carrier substrate 212 facilitates and improves structural strength of the chip package. In addition, in one embodiment, the carrier substrate 212 may be patterned to form an opening 212a exposing the source conducting structure. In one embodiment, there may be a protection layer bump formed in the opening of the protection layer 110, which may be formed during the patterning process of the protection layer 110 according to design requirements. In one embodiment, there may be a protection layer bump formed in the opening of the protection layer 130, which may be formed during the patterning process of the protection layer 130 according to design requirements.

As shown in FIG. 2B, the main difference between this embodiment and the embodiment shown in FIG. 1 is that the embodiment in FIG. 2B includes an under bump metallurgy layer 208S formed on the surface 100b of the semiconductor substrate 100. In one embodiment, the under bump metallurgy layer 208S extends into the opening of the protection layer 110 to be electrically connected to the source conducting structure. The under bump metallurgy layer 208S may be, for example, conformally located on the protection layer 110. The under bump metallurgy layer 208S may extend on a lower surface of the protection layer 110 to increase electrical contact area between the source conducting structure and another electronic element. In one embodiment, there may be a protection layer bump formed in the opening of the protection layer 110, which may be formed during the patterning process of the protection layer 110 according to design requirements. In this case, the under bump metallurgy layer 208S may conformally cover the protection layer bump. In one embodiment, there may be a protection layer bump formed in the opening of the protection layer 130, which may be formed during the patterning process of the protection layer 130 according to design requirements.

As shown in FIG. 2C, the main difference between this embodiment and the embodiment shown in FIG. 2A is that the embodiment in FIG. 2C further includes an under bump metallurgy layer 208S formed on the surface 100b of the semiconductor substrate 100. In one embodiment, the under bump metallurgy layer 208S extends into the opening of the carrier substrate 212 and the opening of the protection layer 110 to be electrically connected to the source conducting structure. The under bump metallurgy layer 208S may be, for example, conformally located on the carrier substrate 212. The under bump metallurgy layer 208S may extend on a lower surface of the carrier substrate 212 to increase electrical contact area between the source conducting structure and another electronic element. In one embodiment, there may be a protection layer bump formed in the opening of the protection layer 110, which may be formed during the patterning process of the protection layer 110 according to design requirements. In this case, the under bump metallurgy layer 208S may conformally cover the protection layer bump. In one embodiment, there may be a protection layer bump formed in the opening of the protection layer 130, which may be formed during the patterning process of the protection layer 130 according to design requirements.

Figure 3B:
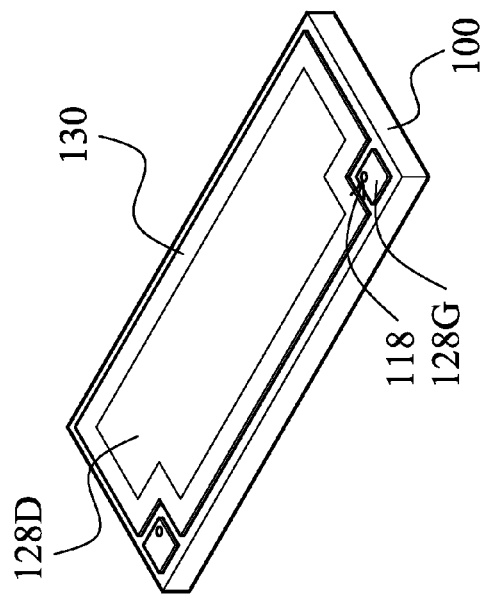
FIGS. 3A and 3B are illustrative top views showing opposite surfaces of a chip package according to an embodiment of the present invention.
Figure 3A:
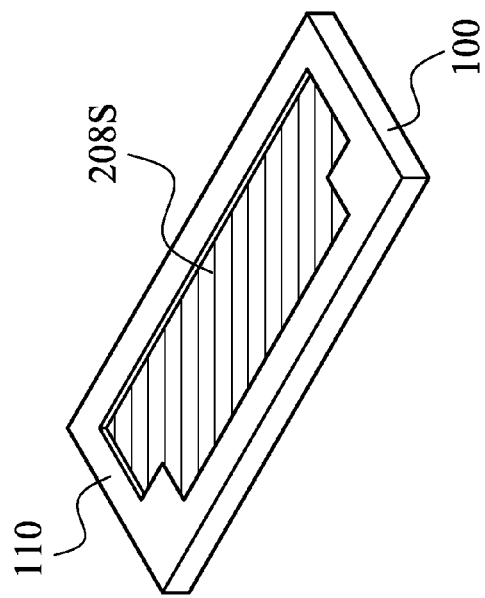

FIGS. 3A and 3B are illustrative top views showing opposite surfaces of a chip package according to an embodiment of the present invention, wherein same or similar reference numbers are used to designate same or similar elements. FIG. 3A may correspond to, for example, the lower surface of the embodiment shown in FIG. 2B, and FIG. 3B may correspond to, for example, the upper surface of the embodiment shown in FIG. 2B, which show possible layouts of the metal layers 208S, 128D, and 128G respectively connected to the source region, the drain region, and the gate, wherein the metal layer 128G is electrically connected to the gate through the through substrate conducting structure formed in the hole 118.

In the embodiment of the invention, the gate conducting structure and the drain conducting structure may be disposed on a same side of the semiconductor substrate through the through substrate conducting structure constructed by the hole and the conducting layer, which facilitates integration with another electronic element, reducing size of electronic products, and reducing transport distances of electrical signals to improve performance of the electronic product. For example, in one embodiment, two chip packages may be stacked, wherein the drain conducting structure of the lower chip package may electrically contact with the source conducting structure of the upper chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a semiconductor substrate having a first surface and a second surface opposite to the first surface;
   a drain region defined in the semiconductor substrate;
   a source region defined in the semiconductor substrate;
   a gate located on the semiconductor substrate or at least partially buried in the semiconductor substrate, wherein a gate dielectric layer is between the gate and the semiconductor substrate;
   a drain conducting structure disposed on the first surface of the semiconductor substrate and electrically connected to the drain region;
   a source conducting structure disposed on the second surface of the semiconductor substrate and electrically connected to the source region, wherein the drain region and the source region are defined on different sides of the semiconductor substrate; and
   a gate conducting structure disposed on the first surface of the semiconductor substrate and electrically connected to the gate, wherein the drain conducting structure and the gate conducting structure are disposed on same side of the semiconductor substrate.

2. The chip package as claimed in claim 1, further comprising:
   a hole extending from the first surface towards the second surface of the semiconductor substrate;
   a conducting layer located on a sidewall of the hole, wherein the conducting layer is electrically connected to the gate and the gate conducting structure;
   an insulating layer located between the conducting layer and the semiconductor substrate.

3. The chip package as claimed in claim 1, further comprising a first protection layer disposed on the first surface of the semiconductor substrate, wherein the first protection layer has at least a first opening and at least a second opening exposing a portion of the drain conducting structure and a portion of the gate conducting structure, respectively.

4. The chip package as claimed in claim 1, further comprising a second protection layer disposed on the second surface of the semiconductor substrate, wherein the second protection layer has at least an opening under a portion of the source conducting structure.

5. The chip package as claimed in claim 4, further comprising an under bump metallurgy layer conformally located on the second protection layer and extending into the opening to be electrically connected to the source conducting structure.

6. The chip package as claimed in claim 4, further comprising a carrier substrate disposed on the second protection layer.

7. The chip package as claimed in claim 6, wherein the carrier substrate has at least an opening under a portion of the source conducting structure.

8. The chip package as claimed in claim 6, further comprising an under bump metallurgy layer conformally located on the carrier substrate and extending into the opening of the second protection layer to be electrically connected to the source conducting structure.

9. The chip package as claimed in claim 1, further comprising a carrier substrate disposed on the second surface of the semiconductor substrate.

10. The chip package as claimed in claim 9, wherein the carrier substrate has at least an opening under a portion of the source conducting structure.

11. A method for forming a chip package, comprising:
    providing a semiconductor substrate having a first surface and a second surface opposite to the first surface, wherein the semiconductor substrate has a drain region and a source region therein, a gate is located on the semiconductor substrate or buried in the semiconductor substrate, and a gate dielectric layer is between the gate and the semiconductor substrate;

forming a drain conducting structure on the first surface of the semiconductor substrate, wherein the drain conducting structure is electrically connected to the drain region;

forming a source conducting structure on the second surface of the semiconductor substrate, wherein the source conducting structure is electrically connected to the source region, and wherein the drain region and the source region are defined on different sides of the semiconductor substrate; and forming a gate conducting structure on the first surface of the semiconductor substrate, wherein the gate conducting structure is electrically connected to the gate, wherein the drain conducting structure and the gate conducting structure are disposed on same side of the semiconductor substrate.

12. The method for forming a chip package as claimed in claim 11, further comprising:

removing a portion of the semiconductor substrate from the first surface of the semiconductor substrate to form a hole extending towards the second surface;

forming an insulating layer on a sidewall of the hole; and forming a conducting layer on the insulating layer in the hole, wherein the conducting layer is electrically connected to the gate and the gate conducting structure.

13. The method for forming a chip package as claimed in claim 12, wherein before the step of forming the hole, the method further comprises thinning the semiconductor substrate from the first surface of the semiconductor substrate.

14. The method for forming a chip package as claimed in claim 13, wherein before the step of thinning the semiconductor substrate, the method further comprises disposing a carrier substrate on the second surface of the semiconductor substrate.

15. The method for forming a chip package as claimed in claim 14, further comprising:

after the conducting layer is formed in the hole, disposing a second carrier substrate on the first surface of the semiconductor substrate;

after the second carrier substrate is disposed, removing the carrier substrate;

disposing the semiconductor substrate on a film frame, wherein the second surface of the semiconductor substrate faces the film frame; and removing the second carrier substrate.

16. The method for forming a chip package as claimed in claim 14, further comprising patterning the carrier substrate to form an opening exposing a portion of the source conducting structure.

17. The method for forming a chip package as claimed in claim 16, further comprising conformally forming an under bump metallurgy layer on the carrier substrate, wherein the under bump metallurgy layer extends into the opening of the carrier substrate to be electrically connected to the source conducting structure.

18. The method for forming a chip package as claimed in claim 11, further comprising forming a protection layer on the second surface of the semiconductor substrate, wherein the protection layer has an opening under a portion of the source conducting structure.

19. The method for forming a chip package as claimed in claim 18, further comprising forming an under bump metallurgy layer on the second surface of the semiconductor substrate, wherein the under bump metallurgy layer extends into the opening of the protection layer to be electrically connected to the source conducting structure.

20. The method for forming a chip package as claimed in claim 11, further comprising forming a protection layer on the first surface of the semiconductor substrate, wherein the protection layer has at least a first opening and at least a second opening exposing a portion of the drain conducting structure and the gate conducting structure, respectively.

* * * * *